(12) United States Patent
Matsumoto et al.

(10) Patent No.: US 6,507,621 B2
(45) Date of Patent: Jan. 14, 2003

(54) COMMUNICATION DEVICE AND COMMUNICATION METHOD

(75) Inventors: Wataru Matsumoto; Yoshikuni Miyata, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/914,360

(22) PCT Filed: Dec. 13, 2000

(86) PCT No.: PCT/JP00/08826
§ 371 (c)(1),
(2), (4) Date: Aug. 27, 2001

(87) PCT Pub. No.: WO01/48928
PCT Pub. Date: Jul. 5, 2001

(65) Prior Publication Data
US 2002/0172303 A1 Nov. 21, 2002

(30) Foreign Application Priority Data
Dec. 27, 1999 (JP) .............................. 11-370315

(51) Int. Cl.[7] .......................... H04L 5/12; H04L 27/04; H04L 27/06; H03M 13/00
(52) U.S. Cl. ...................... 375/262; 375/295; 375/341; 714/784
(58) Field of Search ................................ 375/344, 340, 375/262, 316, 295; 714/755, 756, 784, 786, 787, 762, 761

(56) References Cited

U.S. PATENT DOCUMENTS 5,978,365 A * 11/1999 Yi .............................. 370/331
6,014,411 A * 1/2000 Wang ......................... 714/755
6,289,486 B1 * 9/2001 Lee et al. .................... 714/788

FOREIGN PATENT DOCUMENTS

| JP | 5327787 | 12/1993 |
| JP | 10136046 | 5/1998 |
| JP | 10303801 | 11/1998 |
| JP | 11163841 | 8/1999 |

OTHER PUBLICATIONS

Berrou et al., Proc. ICC793, pp. 1064–1070 (1993).
Berrou et al.. IEEE Trans. Commun., vol. 44, pp. 1261–1271 (1996).

* cited by examiner

Primary Examiner—Tesfaldet Bocure

(57) ABSTRACT

A communication device is provided with a turbo encoder (1) which carries out a turbo encoding process on the lower two bits of transmission data so as to output two-bit information bits and two-bit redundant bits that are generated so as to uniform the correction capabilities with respect to the respective information bits; a turbo decoder (a first decoder (11), a second decoder (15), etc.) which carries out a soft-judgment on the lower two bits of a received signal that are susceptible to degradation in characteristics, and also carries out an error-correction process using Reed Solomon codes thereon so that the information bits of the lower two bits are estimated, and a third judging device (22) which carries out a hard-judging process on the other bits of the received signal so that the other upper bits are estimated.

13 Claims, 7 Drawing Sheets

FIG.1
(a)
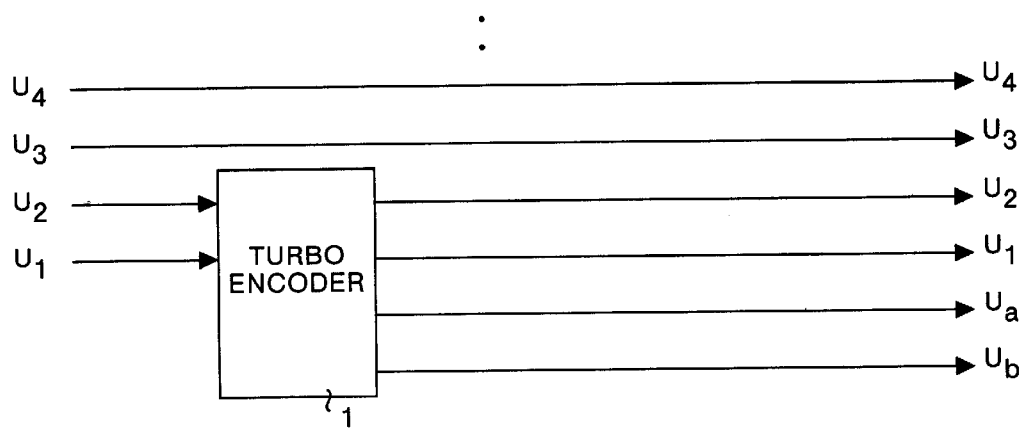
(b)
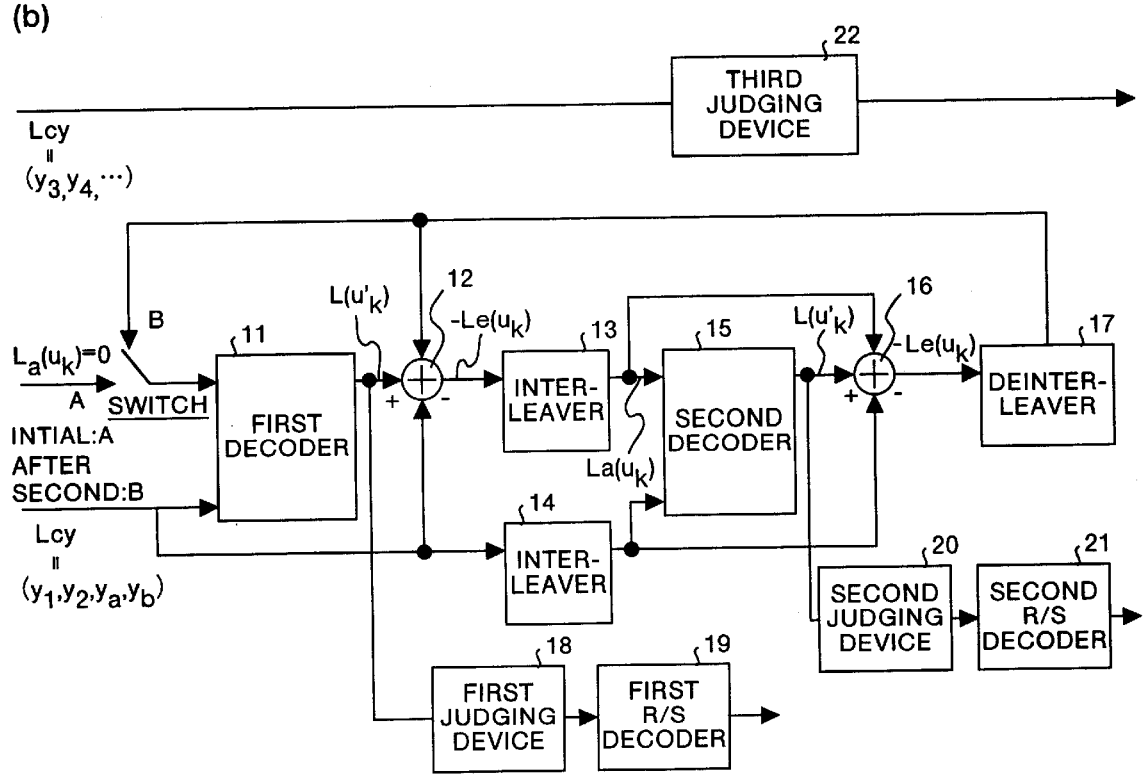

FIG.4
(a)
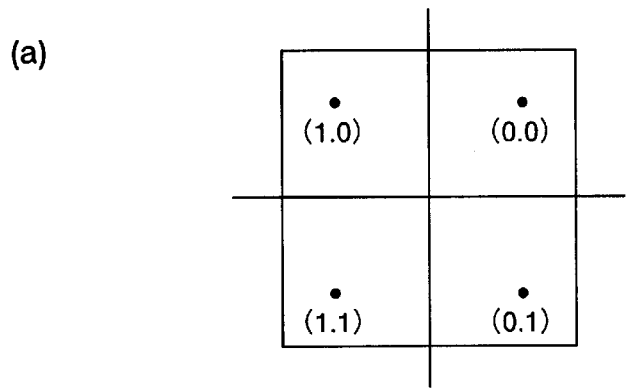
(b)
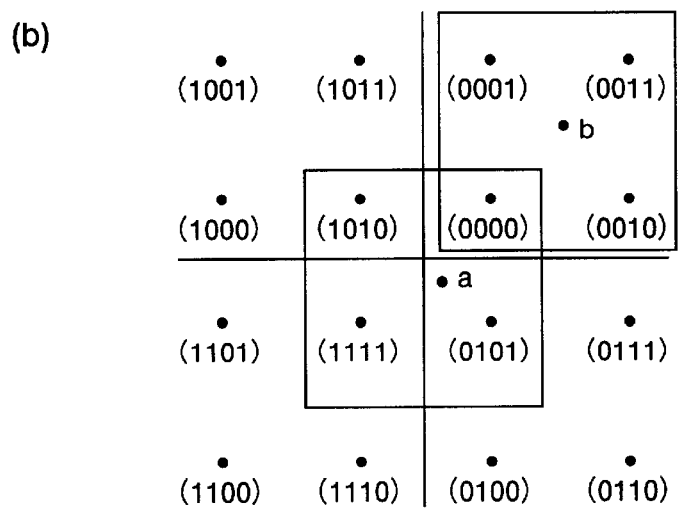
(c)
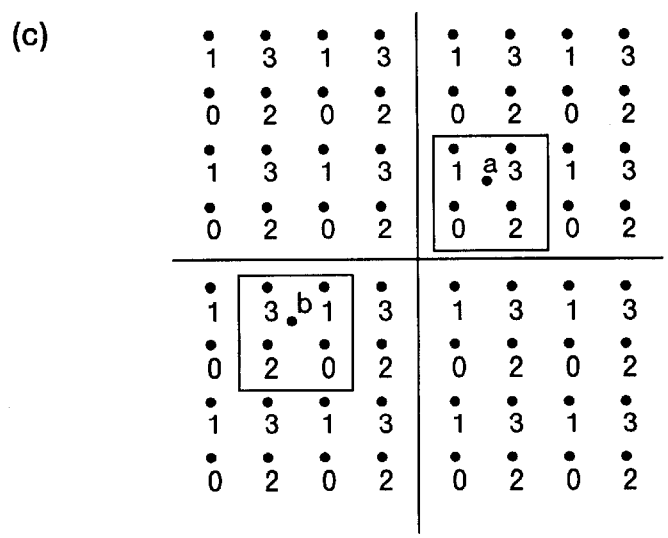

t: INTERLEAVER

FIG.6 PRIOR ART
(a)
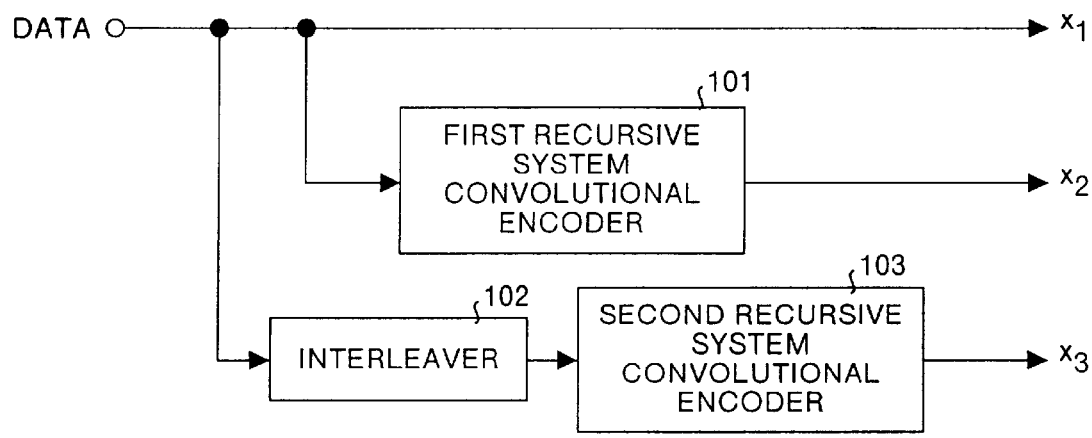
(b)
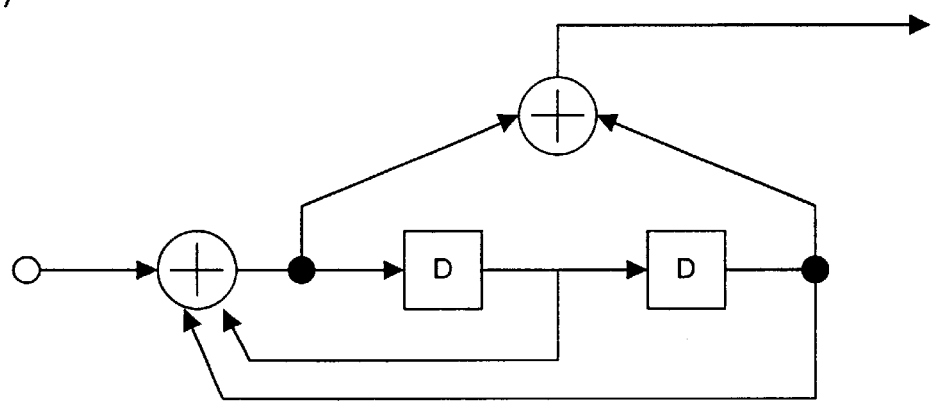

COMMUNICATION DEVICE AND COMMUNICATION METHOD

This application is the national phase under 35 U.S.C. § 371 of PCT International Application No. PCT/JP00/08826 which has an International filing date of Dec. 13, 2000, which designated the United States of America and was not published in English.

TECHNICAL FIELD

The present invention relates a method of and device for communications that use a multi-carrier modem system, and, more particularly, concerns a communication device which realizes data communication through the existing communication lines by using a system such as the DMT (Discrete Multi Tone) modem system and the OFDM (Orthogonal Frequency Division Multiplex) modem system and a communication method for such a communication device. However, the present invention is not intended to be limited to the communication device for carrying out data communication through the DMT modem system, and is applicable to any communication device for carrying out cable communication and radio communication through normal communication lines by using the multi-carrier modem system and a single carrier modem system.

BACKGROUND ART

The conventional communication methods will be explained here. For example, in the wide band CDMA (W-CDMA: Code Division Multiple Access) using the SS (Spread Spectrum) system, turbo codes have been proposed as error-correction codes that greatly exceed convolutional codes in their performances. In the turbo code, a list formed by interleaving an information list is encoded in parallel with a known coding list, and the turbo code is one of the error-correction codes that have attracted the greatest public attention at present, and is said to provide characteristics close to Shannon limit. In the above-mentioned W-CDMA, since the performances of the error-correction code give great effects on the transmission characteristics in the voice transmission and data transmission, the application of the turbo code makes it possible to greatly improve the transmission characteristics.

Operation of transmitting and receiving systems of a conventional communication device using the turbo code will be explained in detail. FIG. 6 is a drawing that shows the construction of a turbo encoder used in the transmitting system. In FIG. 6(a), reference number 101 is a first recursive system convolutional encoder that subjects an information list to a convolutional encoding process to output redundant bits, 102 is an interleaver, and 103 is a second recursive system convolutional encoder that subjects the information list that has been switched by the interleaver 102 to a convolutional encoding process to output redundant bits. FIG. 6(b) is a drawing that shows the inner structures of the first recursive system convolutional encoder 101 and the second recursive system convolutional encoder 103, and the two recursive system convolutional encoders are encoders that only output redundant bits respectively. Moreover, the interleaver 102, which is used in the turbo encoder, randomly switches information bit lists.

The turbo encoder, which is arranged as described above, simultaneously outputs an information bit list: $x_1$, a redundant bit list: $x_2$ obtained by encoding the information bit list through the operation of the first recursive system convolutional encoder 101, and a redundant bit list: $x_3$ obtained by encoding the information bit list that has been interleaved through the operation of the second recursive system convolutional encoder 103.

FIG. 7 is a drawing that shows the construction of the turbo decoder that is used in the receiving system. In FIG. 7, reference number 111 indicates a first decoder that calculates a logarithm likelihood ratio from the received signals $y_1$ and $y_2$. Reference numbers 112 and 116 indicate adders, 113 and 114 indicate interleavers, 115 indicates a second decoder that calculates a logarithm likelihood ratio from the received signals $y_1$ and $y_3$. Reference number 117 indicates a de-interleaver, 118 indicates a judging device which judges the output of the second decoder 115 to output an estimated value of the original information bit list. The received signals $y_1$, $y_2$, $y_3$ are signals that are formed by allowing the information bit list $x_1$ and the redundant bit lists $x_2$, $x_3$ to include influences from noise and phasing in the transmission path.

In this turbo decoder, first, the first decoder 111 calculates the logarithm likelihood ratio: $L(x_{1k}')$ (where k refers to the time) of estimated information bit: $x_{1k}'$ from received signals: $y_{1k}$ and $y_{2k}$. In this case, the logarithm likelihood ratio: $L(x_{1k}')$ is represented by the following equation:

$$L(x_{1k}') = y_{1k} + La(x_{1k}) + Le(x_{1k}) \quad (1)$$

$$= \mathrm{Ln}\frac{Pr(x_{1k}=1|\{Y\})}{Pr(x_{1k}=0|\{Y\})}$$

In equation (1), Le $(x_{1k})$ represents external information, La $(x_{1k})$ represents preliminary information that is external information preceding by one, $P_r(x_{1k}=1|\{Y\})$ represents the probability of an actually transmitted information bit: $x_{1k}$ being 1 under the condition that the entire list $\{Y\}$ of the received signals has been received, and $P_r(x_{1k}=0|\{y\})$ represents the probability of an actually transmitted information bit: $x_{1k}$ being 0 under the condition that the entire list $\{Y\}$ of the received signals has been received. In other words, equation (1) finds a ratio of the probability of the information bit: $x_{1k}$ becoming 1 to the probability of the information bit: $x_{1k}$ being 0.

The adder 112 calculates external information to be given to the second decoder 115 from a logarithm likelihood ratio that is the result of the above-mentioned calculation. Based upon the equation (1), the external information: Le $(x_{1k})$ is represented by the following equation:

$$Le(x_{1k}) = L(x_{1k}) - y_{1k} - La(x_{1k}) \quad (2)$$

Since no preliminary information has been given at the time of the first decoding process, La $(x_{1k})=0$.

In the interleavers 113 and 114, in order to make the received signal: $y_{1k}$ and the external information: Le $(x_{1k})$ coincident with the time of the received signal: $y_3$, the signals are re-arranged. Then, in the same manner as the first decoder 111, based upon the received signal: $y_1$ and the received signal: $y_3$ as well as the external information: Le $(x_{1k})$ preliminarily calculated, the second decoder 115 calculates a logarithm likelihood ratio: $L(x_{1k}')$. Thereafter, in the same manner as the adder 112, the adder 116 calculates the external information Le $(x_{1k})$ by using equation (2). At this time, the external information, rearranged by the interleave 117, is fed back to the first decoder 111 as the preliminary information: La $(x_{1k})$.

Finally, in the turbo decoder, the above-mentioned processes are repeatedly executed predetermined times so that it is possible to calculate a logarithm likelihood ratio with higher precision, and the judgment device 118 makes a judgment based upon this logarithm likelihood ratio, thereby estimating the bit list of the original information. More specifically, for example, the logarithm likelihood ratio shows that "L $(x_{1k}')>0$", the estimated information bit: $x_{1k}'$ is judged as 1, while it shows that "L $(x_{1k}')\leq 0$", the estimated information bit: $x_{1k}'$ is judged as 0.

In this manner, in the conventional communication method, by using the turbo code as the error-correction code, even in the case when the signal point-to-point distance becomes closer as the modulation system is multi-valued, it becomes possible to greatly improve the transmitting property in the voice transmission and data transmission, and consequently to obtain characteristics superior to the known convolutional codes.

However, in the conventional communication method, in order to carry out an error correction with high precision, the turbo encoding process is carried out on all the information lists on the transmitting side, and on the receiving side, all the encoded signals are decoded, and a soft-judgment is then executed thereon. More specifically, for example, in the case of 16 QAM, a judgment is made with respect to all the 4-bit data (0000 to 1111: 4-bit constellation), and in the case of 256 QAM, a judgment is made with respect to all the 8-bit data. Therefore, conventionally, the application of the conventional communication method that carries out judgments on all the data as described above causes a problem of an increase in the number of calculations in the encoder and decoder in response to the multi-valued levels.

Moreover, the demodulation process is executed by carrying out repeated calculations with or without an influence from noise, that is, irrespective of the state of the transmission path. Therefore, even in the case of a good state of the transmission path, the same number of calculations and the same amount of delay as in the case of a bad state thereof are required.

The present invention has been devised to solve the above-mentioned problems, and its object is to provide a method of and device for communications for such a device, which is applicable to any communication system using the multi-carrier modem system and the single-carrier modem system, and makes it possible to achieve a reduction in the number of calculations and to provide a good transmitting property, even in the case when there is an increase in the constellation due to multi-valued levels, and also to greatly reduce the number of calculations and the calculation processing time in the case of a good transmission path.

DISCLOSURE OF THE INVENTION

A communication device in accordance with the present invention, which uses turbo codes as error-correction codes, is provided with: a turbo encoder (corresponding to a turbo encoder 1 in an embodiment which will be described later) which carries out a turbo encoding process on lower two bits in transmission data to output an information bit list of the two bits, a first redundant bit list generated in a first convolutional encoder having the information bit list of the two bits as an input and a second redundant bit list generated in a second convolutional encoder to which the respective information bit lists that have been subjected to interleave processes are switched and input; a first decoder unit (corresponding to a first decoder 11, an adder 12 and interleavers 13, 14) which extracts the information bit list of the two bits and the first redundant bit list from a received signal, and calculates the probability information of estimated information bits by using the results of the extraction and probability information that has been given as preliminary information (in some cases, not given); a second decoder unit (corresponding to a second decoder 15, an adder 16 and a di-interleaver 17) which extracts the information bit list of the two bits and the second redundant bit list, and again calculates the probability information of estimated information bits by using the results of the extraction and the probability information from the first decoder unit to inform the first decoder unit of the results as the preliminary information; a first estimating unit (corresponding to a first judging device 18 and a second judging device 20) which, based upon the results of the calculation processes of probability information by the first and second decoder unit that are repeatedly executed, estimates the information bit list of the original lower two bits for each of the calculation processes; an error correction unit (corresponding to a first R/S decoder 19 and a second R/S decoder 21) which carries out an error checking process on the estimated information bit list by using an error correction code, and terminates the repeating process at the time when a judgment shows that the estimation precision exceeds a predetermined reference, as well as simultaneously carrying out an error-correction process on the estimated information bit list of the original lower two bits by using an error correction code; and a second estimating unit (corresponding to a third judging device 22) which hard-judges the other upper bits in the received signal so as to estimate an information bit list of the original upper bits.

A communication device in accordance with the next invention, which serves as a receiver using the turbo codes as error-correction codes, is provided with: a first decoder unit which extracts an information bit list of the two bits and a first redundant bit list from a received signal, and calculates the probability information of estimated information bits by using the results of the extraction and probability information that has been given as preliminary information (in some cases, not given); a second decoder unit which extracts the information bit list of the two bits and a second redundant bit list, and again calculates the probability information of estimated information bits by using the results of the extraction and the probability information from the first decoder unit to inform the first decoder unit of the results as the preliminary information; a first estimating unit which, based upon the results of the calculation processes of probability information by the first and second decoder unit that are repeatedly executed, estimates the information bit list of the original lower two bits for each of the calculation processes; an error correction unit which carries out an error checking process on the estimated information bit list by using an error correction code, and terminates the repeating process at the time when a judgment shows that the estimation precision exceeds a predetermined reference, as well as simultaneously carrying out an error-correction process on the estimated information bit list of the original lower two bits by using an error correction code; and a second estimating unit which hard-judges the other upper bits in the received signal so as to estimate an information bit list of the original upper bits.

In a communication device in accordance with the next invention, the error correction unit carries out an error checking process each time the information bit list of the lower two bits is estimated, and terminates the repeating process at the time when a judgment shows that "no error exists" in the estimated information bit list.

In a communication device in accordance with the next invention, the error correction unit carries out an error checking process each time the information bit list of the lower two bits is estimated, and terminates the repeating process at the time when a judgment shows that "neither the information bit list estimated based upon the probability information from the first decoding unit nor the information bit list estimated based upon the probability information from the second decoding unit includes any error" in the estimated information bit list.

In a communication device in accordance with the next invention, the error correction unit carries out the repeating process for a predetermined number of times, and after the bit error rate has been reduced, an error-correction process is carried out on the estimated information bit list of the original lower two bits by using error correction codes.

A communication device in accordance with the next invention, which serves as a receiver using the turbo codes as error-correction codes, is provided with: a turbo encoder which carries out a turbo encoding process on lower two bits in transmission data to output an information bit list of the two bits, a first redundant bit list generated in a first convolutional encoder having the information bit list of the two bits as an input and a second redundant bit list generated in a second convolutional encoder to which the respective information bit lists that have been subjected to interleave processes are switched and input.

A communication method in accordance with the next invention, which uses turbo codes as error-correction codes, is provided with: a turbo encoding step of carrying out a turbo encoding process on lower two bits in transmission data to output an information bit list of the two bits, a first redundant bit list generated in a first convolutional encoder having the information bit list of the two bits as an input and a second redundant bit list generated in a second convolutional encoder to which the respective information bit lists that have been subjected to interleave processes are switched and input; a first decoding step of extracting the information bit list of the two bits and the first redundant bit list from a received signal, as well as calculating the probability information of estimated information bits by using the results of the extraction and probability information that has been given as preliminary information (in some cases, not given); a second decoding step of further extracting the information bit list of the two bits and the second redundant bit list, as well as again calculating the probability information of estimated information bits by using the results of the extraction and the probability information from the first decoding step to inform the first decoding step of the results as the preliminary information; a first estimating step of estimating the information bit list of the original lower two bits for each of the calculation processes, based upon the results of the calculation processes of probability information by the first and second decoding steps that are repeatedly executed; an error-correction step of carrying out an error checking process on the estimated information bit list by using an error correction code, and terminating the repeating process at the time when a judgment shows that the estimation precision exceeds a predetermined reference, as well as simultaneously carrying out an error-correction process on the estimated information bit list of the original lower two bits by using an error correction code; and a second estimating step of hard-judging the other upper bits in the received signal so as to estimate an information bit list of the original upper bits.

In the communication method in accordance with the next invention, the error correction step is designed to carry out an error checking process each time the information bit list of the lower two bits is estimated, and also to terminate the repeating process at the time when a judgment shows that "no error exists" in the estimated information bit list.

In the communication method in accordance with the next invention, the error correction step is designed to carry out an error checking process each time the information bit list of the lower two bits is estimated, and also to terminate the repeating process at the time when a judgment shows that neither the information bit list estimated based upon the probability information from the first decoding step nor the information bit list estimated based upon the probability information from the second decoding step includes "any error" in the estimated information bit list.

In the communication method in accordance with the next invention, the error correction step is designed to carry out the repeating process for a predetermined number of times, and after the bit error rate has been reduced, an error-correction process is carried out on the estimated information bit list of the original lower two bits by using error correction codes.

BRIEF DESCRIPTION OF THE DRAWINGS

FIG. 1 is a drawing that shows constructions of an encoder and a decoder that are used in a communication device in accordance with the present invention;

FIG. 4 is a drawing that shows layouts of signal points in various digital modulations;

FIG. 6 is a drawing that shows a construction of a conventional turbo encoder.

BEST MODE FOR CARRYING OUT THE INVENTION

Figure 2:
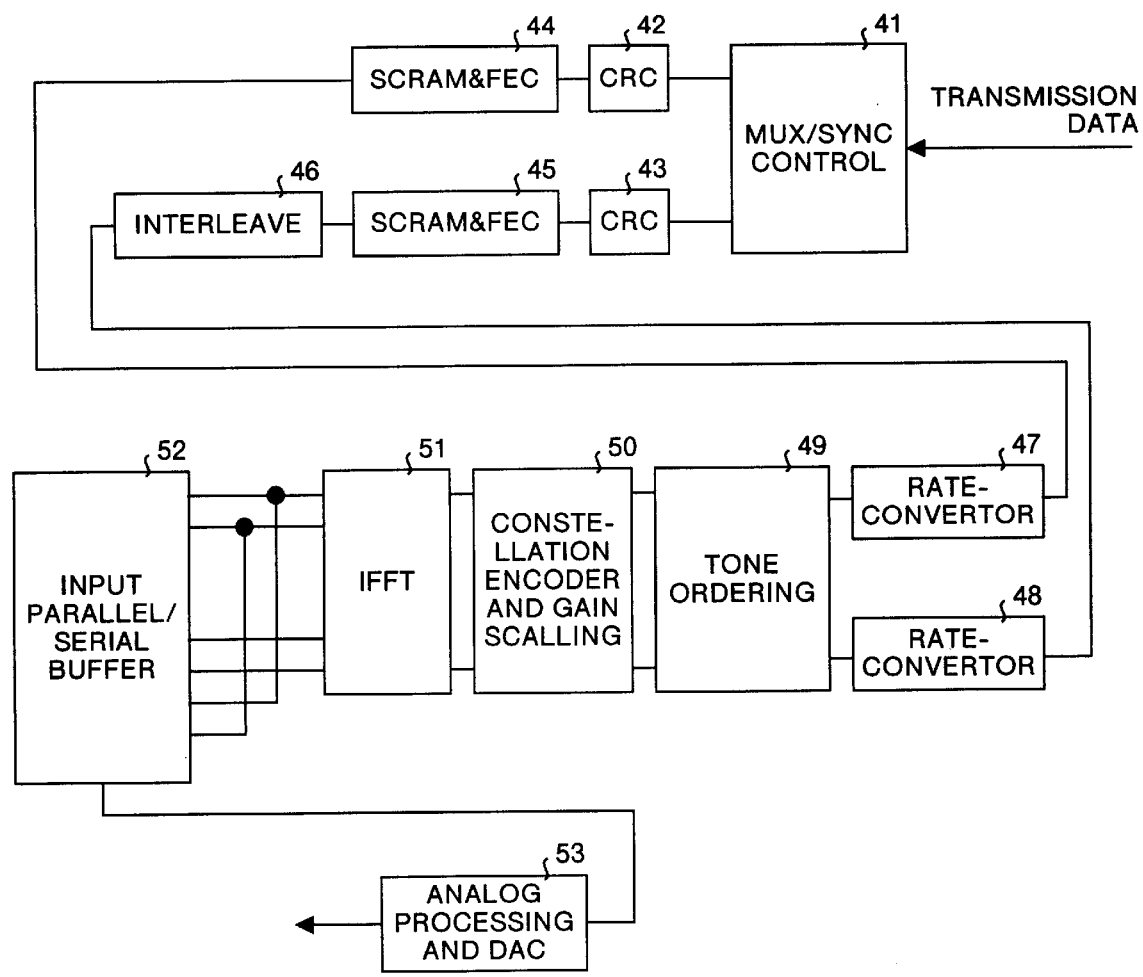
FIG. 2 is a drawing that shows a construction of a transmitting system of a transmitter in accordance with the present invention.

Embodiments of a method of and device for communications in accordance with the present invention in detail while referring to the accompanying drawings. However, the present invention is not intended to be limited by these embodiments.

FIG. 1 is a drawing that shows constructions of an encoder (a turbo encoder) and a decoder (a combination of a turbo decoder, a hard-judging device and a R/S (Reed Solomon code) decoder) used in a communication device in accordance with the present invention. Precisely, FIG. 1(a) shows the construction of the encoder of the present embodiment, while FIG. 1(b) shows the construction of the decoder thereof. In the communication device in accordance with the present embodiment, both the constructions of the encoder and decoder are installed so that it is possible to provide a data error-correction capability with high precision, and consequently to obtain a superior transmitting property in data communication and voice communication. For convenience of explanation, it is assumed that both the constructions are provided. However, for example, only the encoder may be installed in a transmitter, or only the decoder may be installed in a receiver.

In the encoder in FIG. 1(a), reference number 1 indicates a turbo encoder that uses turbo codes as error-correction codes so as to provide a performance close to the Shannon limit. For example, with respect to an input of two-bit information bits the turbo encoder 1 outputs two-bit information bits and two-bit redundant bits, and the respective redundant bits are generated so as to uniform the correction capabilities with respect to the information bits on the receiving side.

In the decoder shown in FIG. 1(b), reference numeral 11 indicates a first decoder which calculates the logarithm likeliness ratio from a received signal: Lcy (corresponding to received signals: $y_2$, $y_1$, $y_a$, as will be described later), 12 and 16 indicate adders; 13 and 14 indicate interleavers, 15 indicates a second decoder for calculating the logarithm likeliness ratio from the received signal: Lcy (corresponding to received signals: $y_2$, $y_1$, $y_b$, as will be described later), 17 indicates a de-interleaver, 18 indicates a first judging device which judges the output of the first decoder 15 to output an estimated value of the original information bit list, 19 indicates a first R/S decoder which decodes Reed Solomon codes to output an information bit list with higher precision, 20 indicates a second judging device which judges the output of the second decoder 15 to output an estimated value of the original information bit list, 21 indicates a second R/S decoder which decodes Reed Solomon codes to output an information bit list with higher precision, and 22 indicates a third judging device for hard-judging the received signal Lcy (corresponding to received signals: $y_3$, $y_4$ . . . , as will be described later) to output an estimated value of the original information bit list.

Prior to explaining the operations of the encoder and decoder, an explanation will be briefly given of the basic operation of the communication device in the present invention by referring to the figures. For example, with respect to the cable-type digital communication system for carrying out data communication by using the DMT (Discrete Multi Tone) modem system, there are xDSL communication systems including an ADSL (Asymmetric Digital Subscriber Line) communication system that executes a high-speed digital communication with several mega bits/second by using the existing telephone lines and an HDSL (high-bit-rate Digital Subscriber Line) communication system. Here, these systems are standardized in T1.413 of the ANSI, etc. In the explanation of the present embodiment, for example, a communication device that is applicable to the ADSL is used.

FIG. 2 is a drawing that shows the construction of a transmitting system of a communication device in accordance with the present invention. In FIG. 2, in the transmitting system, the transmission data is multiplexed by a multiplex/synch control (corresponding to a MUS/SYNC CONTROL in the Figure) 41, and error-detecting codes are added to the transmission data that has been multiplexed in cyclic redundancy checks (CRC) 42, 43, and FEC-use codes are added thereto and a scrambling process is also applied thereto in forward error corrections (corresponding to SCRAM & FEC) 44, 45.

There are two paths from the multiplex/synch control 41 to a tone ordering 49, and one is an interleaved data buffer path containing the interleave 46, and the other is a fast data buffer path that does not contain the interleave; thus, for example, the interleaved data buffer path for executing an interleaving process has a greater delay.

Thereafter, the transmission data is subjected to a rate converting process in rate converters (corresponding to RATE-CONVERTORS) 47, 48, and then subjected to a tone ordering process in the tone ordering (corresponding to TONE ORDERRING) 49. Based upon the transmission data after the tone ordering process, constellation data is formed in a constellation encoder/gain scaling (corresponding to CONSTELLATION AND GAIN SCALING) 50, and this is subjected to an inverse Fast Fourier transform in an inverse Fast Fourier transform section (corresponding to IFFT: Inverse Fast Fourier transform) 51.

Finally, after the Fourier transform, the parallel data is converted to serial data in an input parallel/serial buffer (corresponding to INPUT PARALLEL/SERIAL BUFFER) 52, and the digital waveform is converted to an analog waveform in analog processing/digital-analog converter (corresponding to ANALOG PROCESSING AND DAC) 53; then, after having been subjected to a filtering process, the resulting transmission data is transmitted to a telephone line.

Figure 3:
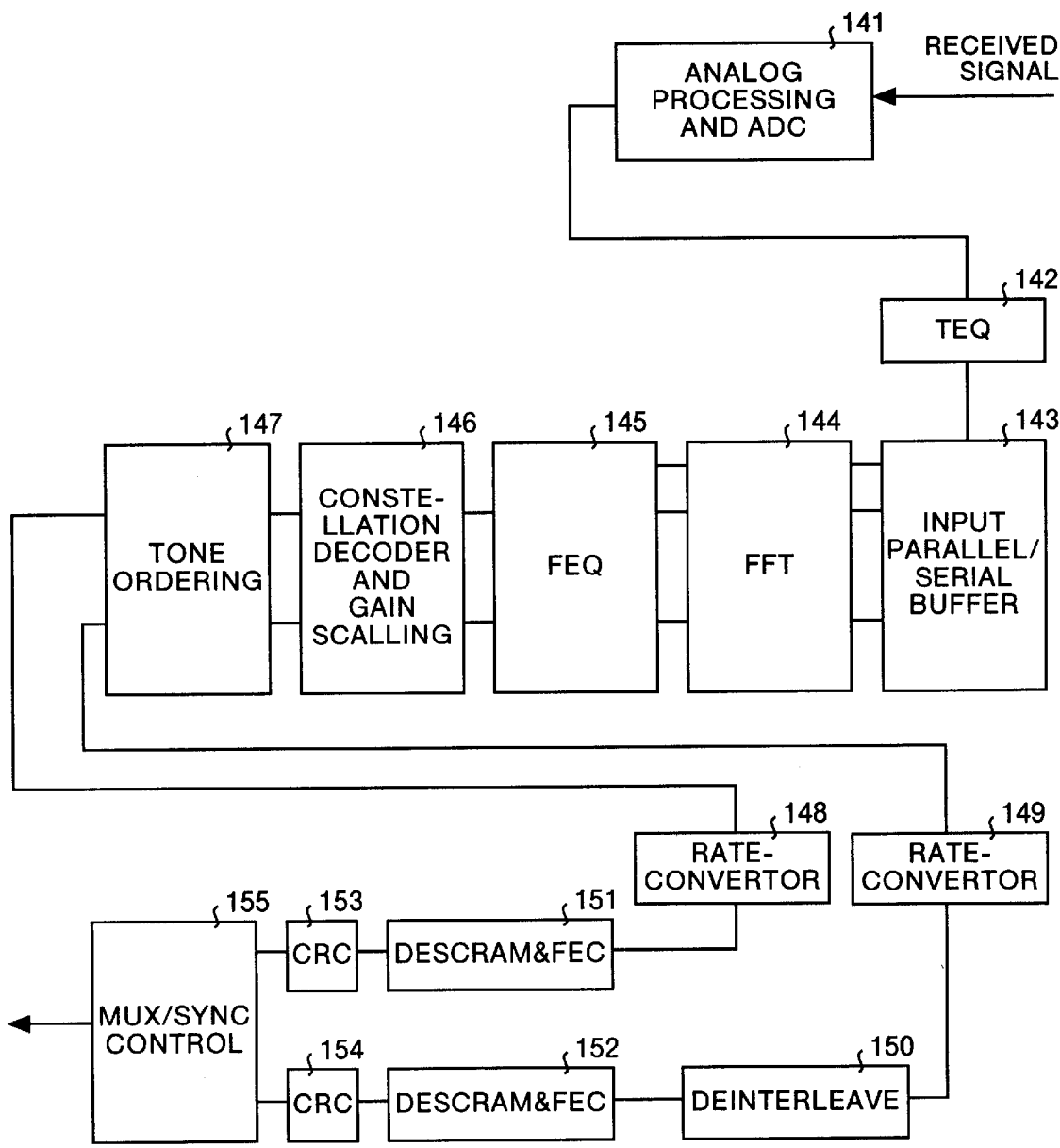
FIG. 3 is a drawing that shows a construction of a receiving system in accordance with the present invention.

FIG. 3 is a drawing that shows a construction of a receiving system of the communication device in accordance with the present invention. In FIG. 3, in the receiving system, the received data (corresponding to the above-mentioned transmission data) is subjected to a filtering process in an analog processing/analog-digital converter (corresponding to ANALOG PROCESSING AND ADC in the Figure) 141, and the analog waveform is converted to a digital waveform; thereafter, this is subjected to an adaptive equalization process with respect to the time domain in a time domain equalizer (corresponding to TEQ) 142.

With respect to the data having been subjected to the adaptive equalization process, this is converted from serial data to parallel data in an input serial/parallel buffer (corresponding to INPUT SERIAL/PARALLEL BUFFER) 143, and this parallel data is subjected to a fast Fourier transform in a fast Fourier transform section (corresponding to FET: Fast Fourier transform) 144; thereafter, this is subjected to an adaptive equalization process with respect to the frequency domain in a frequency domain equalizer (corresponding to FEQ) 145.

The data, which has been subjected to the adaptive equalization process with respect to the frequency domain, is subjected to a decoding process (most likeliness decoding method) and a tone ordering process in a constellation decoder/gain scaling (corresponding to CONSTELLATION DECODER AND GAIN SCALING) 146 and a tone ordering (corresponding to TONE ORDERING) 147 so that this is converted to serial data. Thereafter, this is subjected to processes, such as a rate converting process by rate converters (corresponding to RATE-CONVERTER) 148, 149, a de-interleaving process in a de-interleave (corresponding to DEINTERLEAVE) 150, an FEC process and a de-scrambling process in forward error corrections (corresponding to DESCRAM & FEC) 151, 152, and a cyclic redundancy check in cyclic redundancy checks (corresponding to cyclic redundancy checks) 153, 154; thus, the received data is finally reproduced from a multiplex/synch control (corresponding to MUX/SYNC CONTROL) 155.

In the communication device according to the present invention, the two paths are provided respectively in the receiving system and transmitting system, and by using these two paths properly or using these two paths at the same time, it is possible to realize a low-transmission delay and data communication with high rates.

The encoder, shown in FIG. 1(a), is positioned at the constellation encoder/gain scaling 50 in the transmitting system, and the decoder, shown in FIG. 1(b), is positioned at the constellation decoder/gain scaling 146 in the receiving system.

Detailed explanation about the operations of the encoder (transmitting system) and the decoder (receiving system)

will be given here. First, an explanation will be given of the operation of the encoder shown in FIG. 1(a). In the present embodiment, with respect to the multi-value Quadrature Amplitude Modulation (QAM), for example, a 16 QAM system is adopted. Moreover, in the encoder of the present embodiment, different from the conventional technique that executes a turbo encoding process on all the input data, the turbo encoding process is executed on the input data of the lower two bits as illustrated in FIG. 1(a), and with respect to the other upper bits, the input data, as it is, is output.

The following description will discuss why only the lower two bits of the input data are subjected to the turbo encoding process. FIG. 4 is a drawing that shows the layout of signal points in various digital modulations; and more specifically, FIG. 4(a) shows the layout of signal points in the 4-phase PSK (Phase Shift Keying) system, FIG. 4(b) shows the layout of signal points in the 16 QAM system, and FIG. 4(c) shows the layout of signal points in the 64 QAM system.

For example, when, in the layout of signal points in all the modulation systems, the received signal points are a or b positions, on the receiving side, normally, the data having the most likelihood is estimated as the information bit list (transmission data) through a soft-judgment. In other words, the signal point having the closest distance to the received signal point is judged as the transmission data. However, at this time, for example, when attention is given to the received signal points a and b in FIG. 5, it is found that the four points, which are closest to the received signal point, have lower two bits represented by (0,0) (0, 1) (1, 0) (1, 1), in any of the cases (corresponding to FIGS. 4(a), (b) and (c)). Therefore, in the present embodiment, with respect to the lower two bits of the four signal points (the four points closest to received signal point) that are more likely to have degradation in the characteristics, the turbo encoding process having a superior error-correction capability is applied thereto, and a soft-judgment is carried out on the receiving side. In contrast, with respect to the other higher bits that are less likely to have degradation in the characteristics, these bits are output as they are, and a hard-judgment is made on the receiving side.

Thus, the characteristics that might have degradation due to multi-valued levels can be improved, and since the turbo encoding process is carried out only on the lower two bits of the received signal, it is possible to greatly reduce the number of calculations as compared with the conventional technique that applies the turbo encoding process to all the bits.

Figure 5:
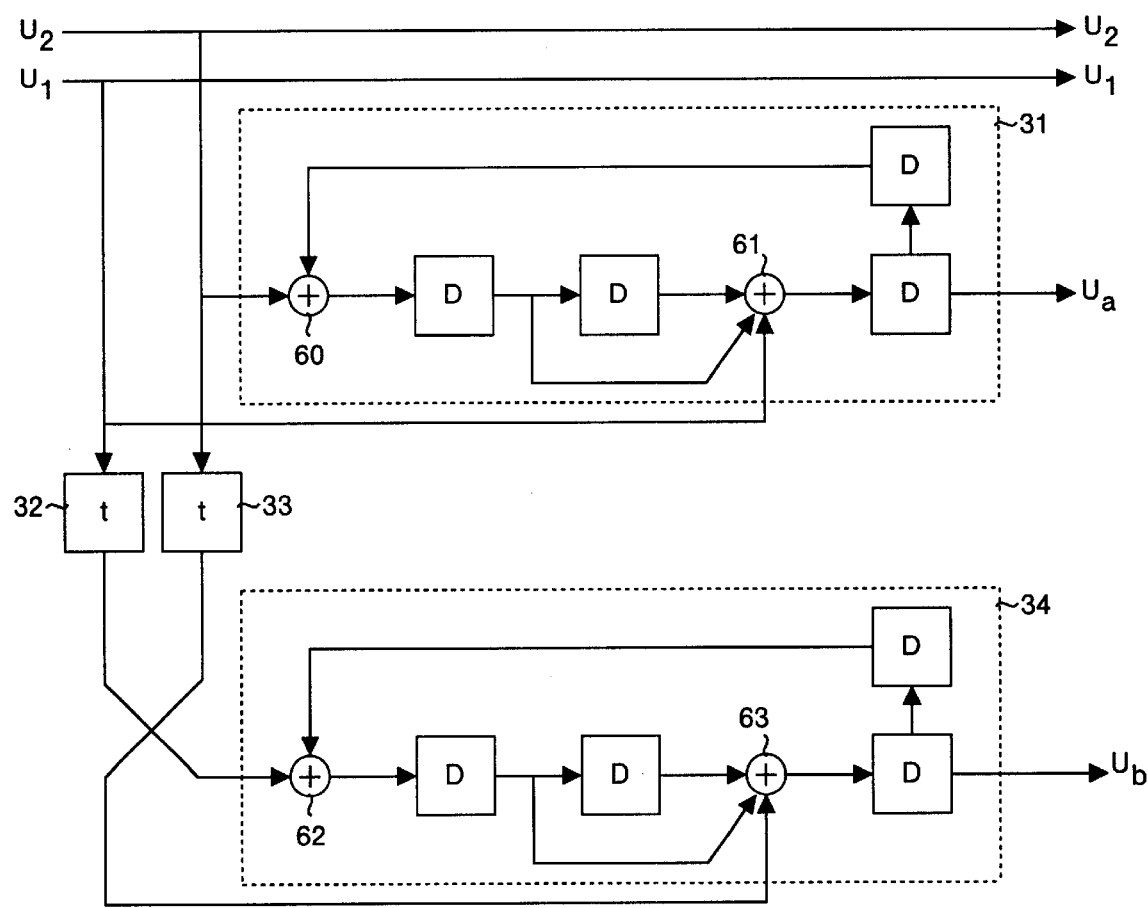
FIG. 5 is a drawing that shows a circuit construction of a turbo encoder 1.
Figure 7:
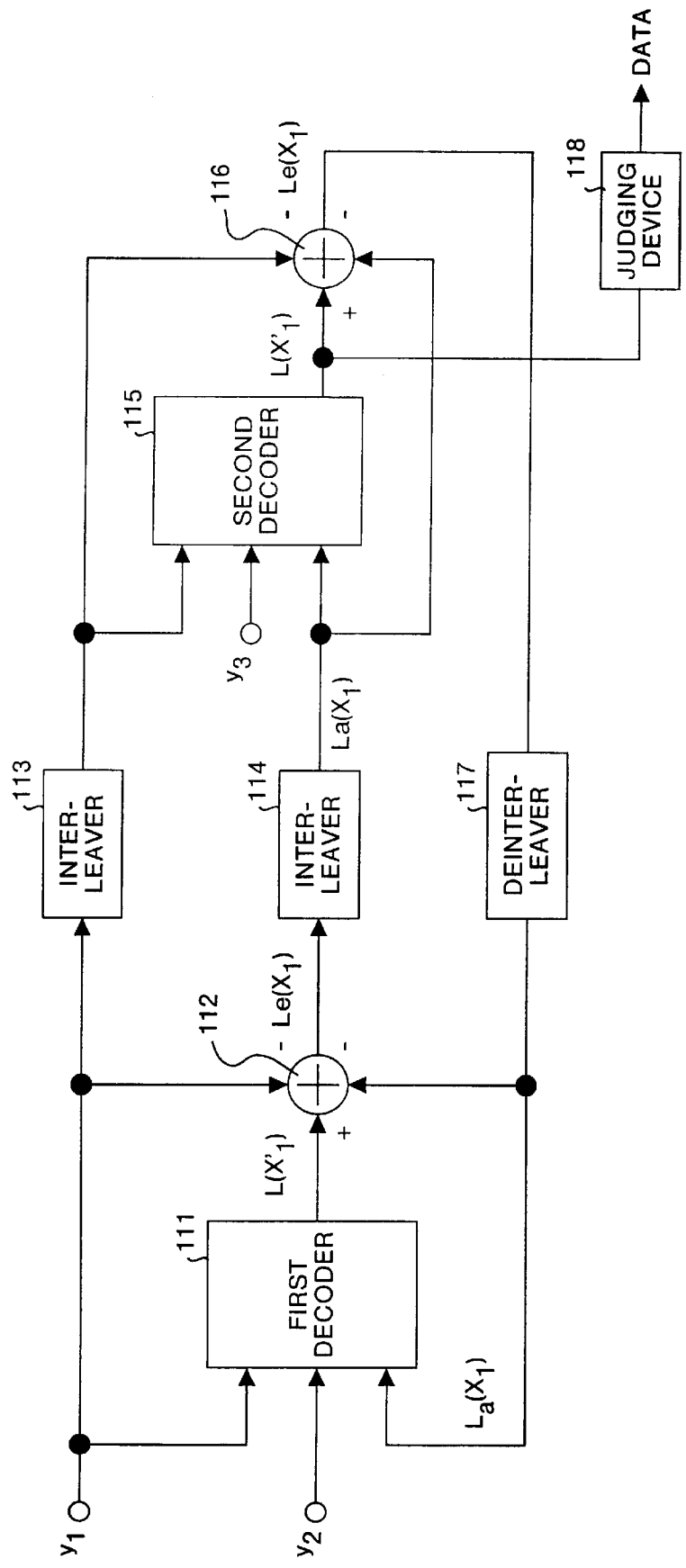
FIG. 7 is a drawing that shows a construction of a conventional turbo encoder.

The following description will discuss the operation of the turbo encoder 1 shown in FIG. 1(a) that carries out the turbo encoding process on the input lower two bits of the received data: $u_1$ and $u_2$. FIG. 5 is a drawing that shows the circuit construction of the turbo encoder 1. In FIG. 5, reference number 31 indicates a first recursive system convolutional encoder, 32 and 33 indicate interleavers, and 34 indicates a second recursive system convolutional encoder. In the turbo encoder 1, the transmission data: $u_1$ and $u_2$ corresponding the information list, redundant data: $u_a$ obtained by encoding the transmission data through the process of the first recursive system convolutional encoder 31 and redundant data: $u_b$ (having time different from the other data) obtained by encoding the transmission data that has been interleave-processed through the second recursive system convolutional encoder 34, are simultaneously output.

Moreover, normally, in the known turbo encoder, for example, the transmission data: $u_2$ is input to the respective adders 60 and 62 on the preceding stages of the first recursive system convolutional encoder 31 and the second recursive system convolutional encoder 34, and the other transmission data: $u_1$ is input to the respective adders 61 and 63 on the succeeding stages of the first recursive system convolutional encoder 31 and the second recursive system convolutional encoder 34; thus, redundant data: $u_a$ and $u_b$ are output as the outputs of the respective encoders. However, in the turbo encoders of this type, the number of delay devices is different between the transmission data: $u_1$ and $u_2$, with the result that a bias occurs in the weights of the redundant bits, and the resulting problem is that estimation precisions of the transmission data: $u_1$ and $u_2$ on the receiving side obtained by using the redundant data: $u_a$ and $u_b$ are not uniformed.

Therefore, in order to uniform the estimation precisions of the transmission data: $u_1$ and $u_2$, for example, the transmission data: $u_2$ is input to the adder 60 on the preceding stage of the first recursive system convolutional encoder 31, and the transmission data: $u_2$ that has been subjected to the interleave process is input to the adder 63 on the succeeding stage of the second recursive system convolutional encoder 34. Furthermore, the other transmission data: $u_1$ is input to the adder 61 on the succeeding stage of the first recursive system convolutional encoder 31, and the transmission data: $u_1$ that has been subjected to the interleave process is input to the adder 62 on the preceding stage of the second recursive system convolutional encoder 34.

In this manner, by the effects of the interleave process, it is possible to improve the error correction capability with respect to burst-type data errors, and by switching the inputs of the transmission data: $u_1$ and $u_2$ between the first recursive system convolutional encoder 31 and the second recursive system convolutional encoder 34, it becomes possible to uniform the estimation precisions of the transmission data: $u_1$ and $u_2$ on the receiving side.

Operation of the decoder shown in FIG. 1(b) will be explained. For example, the 16 QAM system is adopted as the multi-value quadrature amplitude modulation (QAM). In the decoder in the present embodiment, a turbo decoding process is carried out on the lower two bits of the received data so that the original transmission data is estimated by a soft judgment, and with respect to the other upper bits, the received data is subjected to a hard judgment in the third judging device 22 so that the original transmission data is estimated. Here, the received signals Lcy: $y_4$, $y_3$, $y_2$, $y_1$, $y_a$, $y_b$ are signals obtained by allowing the respective outputs on the transmitting side: $u_4$, $u_3$, $u_2$, $u_1$, $u_a$, $u_b$ to contain influences from noise and phasing due to the transmission path.

First, in the turbo decoder, upon receipt of the signals Lcy: $y_4$, $y_3$, $y_2$, $y_1$, $y_a$, $y_b$, the first decoder 11 extracts the received signals Lcy: $y_2$, $y_1$, $y_a$, and calculates the logarithm likelihood ratio: $L(U_{1k}')$, $L(U_{2k}')$ (with k representing the time) of information bits: $u_{1k}'$, $u_{2k}'$ (corresponding to the original transmission data: $u_{1k}$, $u_{2k}$) estimated by these received signals. Here, with respect to the decoder for calculating the logarithm likelihood ratio, for example, the known maximum posterior probability decoder (MAP algorithm: Maximum A-Posteriori) is often used; however, for example, the known Vitabi decoder may be used.

In this case, the logarithm likelihood ratio: $L(u_{1k}')$, $L(u_{2k}')$ are represented by the following equations:

$$L(u'_{1k}) = L_{cy} + La(u_{1k}) + Le(u_{1k}) \quad (3)$$
$$= \text{Ln} \frac{Pr(u_{1k} = 1|\{Lcy\})}{Pr(u_{1k} = 0|\{Lcy\})}$$

$$L(u'_{2k}) = L_{cy} + La(u_{2k}) + Le(u_{2k}) \quad (4)$$
$$= \text{Ln} \frac{Pr(u_{2k} = 1|\{Lcy\})}{Pr(u_{2k} = 0|\{Lcy\})}$$

In these equations, Le $(u_{1k})$, Le $(u_{2k})$ represent external information; La $(u_{1k})$, La $(u_{2k})$ represent pre-information that is external information preceding by one; $P_r$ $(u_{1k}=1|\{Lcy\})$ represents the posterior probability of the actually transmitted information bit: $u_{1k}$ being 1, under the condition that the received signals Lcy: $y_2$, $y_1$, $y_a$ have been received; $P_r$ $(u_{1k}=0|\{Lcy\})$ represents the posterior probability of the actually transmitted information bit: $u_{1k}$ being 0; $P_r$ $(u_{2k}=1|\{Lcy\})$ represents the posterior probability of the actually transmitted information bit: $u_{2k}$ being 1 under the condition that the received signals Lcy: $y_2$, $y_1$, $y_a$ have been received; and $P_r$ $(u_{2k}=0|\{Lcy\})$ represents the posterior probability of the actually transmitted information bit: $u_{2k}$ being 0. In other words, in equations (3) and (4), the probability of $u_{2k}$ being 1 with respect to the probability of $u_{2k}$ being 0 and the probability of $u_{1k}$ being 1 with respect to the probability of $u_{1k}$ being 0 are found.

In the adder 12, external information for the second decoder 15 is calculated from the logarithm likelihood ratio that is the above calculation result. The external information: Le $(u_{1k})$, Le $(u_{2k})$ is represented as follows based upon the above-mentioned equations (3) and (4):

$$Le\ (u_{1k}) = L\ (u_{1k}') - Lcy - La\ (u_{1k}) \quad (5)$$

$$Le\ (u_{2k}) = L\ (u_{2k}') - Lcy - La\ (u_{2k}) \quad (6)$$

In the first decoding process, since no pre-information is found, La $(u_{1k})=0$, and La $(u_{2k})=0$.

In the interleavers 13 and 14, the signals are re-arranged based upon the received signal Lcy and the external information Le $(u_{1k})$, Le $(u_{2k})$. Then, in the second decoder 15, in the same manner as the first decoder 11, based upon the received signal Lcy and pre-information: La $(u_{1k})$, La $(u_{2k})$ that has been preliminarily calculated, the logarithm likelihood ratio: L $(u_{1k}')$, L $(u_{2k}')$ is calculated. In this case, $P_r$ $(u_{1k}=1|\{Lcy\})$ represents the posterior probability of the actually transmitted information bit: $u_{1k}$ being 1, under the condition that the received signals Lcy: $y_2$, $y_1$, $y_b$ have been received; $P_r$ $(u_{1k}=0|\{Lcy\})$ represents the posterior probability of the actually transmitted information bit: $u_{1k}$ being 0; $P_r$ $(u_{2k}=1|\{Lcy\})$ represents the posterior probability of the actually transmitted information bit: $u_{2k}$ being 1 under the condition that the received signals Lcy: $y_2$, $y_1$, $y_b$ have been received; and $P_r$ $(u_{2k}=0|\{Lcy\})$ represents the posterior probability of the actually transmitted information bit: $u_{2k}$ being 0.

Thereafter, in the adder 16, in the same manner as the adder 12, external information: Le $(u_{1k})$, Le $(u_{2k})$ is calculated by using equations (5) and (6). At this time, the external information, re-arranged by the de-interleave 17, is fed back to the first decoder 11 as the pre-information: La $(u_{1k})$, La $(u_{2k})$.

Thereafter, the turbo decoder repeats the above-mentioned processes for predetermined times so that the logarithm likelihood ratio with higher precision is calculated. Finally, the first judging device 18 and the second judging device 20 judge the signals based upon the logarithm likelihood ratio so as to estimate the original transmission data. More specifically, for example, if the logarithm likelihood ratio shows "L $(u_{1k}')>0$"; then, the estimated information bit $u_{1k}'$ is judged as 1, and if it shows "L $(u_{1k}')\leqq 0$"; then, the estimated information bit $u_{1k}'$ is judged as 0; in the same manner, if the logarithm likelihood ratio shows "L $(u_{2k}')>0$"; then, the estimated information bit $u_{2k}'$ is judged as 1, and if it shows "L $(u_{2k}')\leqq 0$"; then, the estimated information bit $u_{2k}'$ is judged as 0. With respect to the received signals Lcy: $y_3$, $y_4$, . . . that are simultaneously received, they are hard-judged by using the third judging device 22.

Finally, in the first R/S decoder 19 and the second R/S decoder 21 carry out error checking processes through a predetermined method using Reed Solomon codes, and the above-mentioned repeating process is terminated at the time when it is judged that the estimation precision has exceeded a predetermined reference. Then, an error-correction process is carried out by using Reed Solomon codes on the original transmission data that has been estimated by the respective judging devices in the above-mentioned manner, thereby making it possible to output transmission data having higher estimation precision.

Referring to specific examples, the following description will discuss estimating methods of the original transmission data by using the first R/S decoder 19 and the second R/S decoder 21. Three methods are assumed as the specific examples. In the first method, for example, each time the first judging device 18 or the second judging device 20 estimates transmission data, the corresponding first R/S decoder 19 or second R/S decoder 21 alternately carries out an error checking process, and at the time when either one of the R/S decoders has made a judgment that "no error exists", the above-mentioned repeating process by the turbo encoder is terminated; then, an error-correction process is carried out on the original transmission data that has been estimated as described above by using Reed Solomon codes, thereby making it possible to output transmission data having higher estimation precision.

In the second method, for example, each time the first judging device 18 or the second judging device 20 estimates transmission data, the corresponding first R/S decoder 19 or second R/S decoder 21 alternately carries out an error checking process, and at the time when the two R/S decoders have made a judgment that "no error exists", the above-mentioned repeating process by the turbo encoder is terminated; then, an error-correction process is carried out on the original transmission data that has been estimated as described above by using Reed Solomon codes, thereby making it possible to output transmission data having higher estimation precision.

Moreover, in the third method, in an attempt to solve a problem in which the judgment, "no error exists", is erroneously made by the first and second methods with the result that the repeating process is terminated and an erroneous correcting operation is carried out, for example, the repeating process is executed for a predetermined number of times, and after the bit error rate has been reduced to a predetermined level, an error-correction process is carried out on the original transmission data that has been estimated as described above, by using Reed Solomon codes, thereby making it possible to output transmission data with higher estimation precision.

In this manner, even if the constellation increases as the modulation system is multi-valued, the turbo decoder for carrying out a soft-judgment and an error-correction process using Reed Solomon codes on the lower two bits of the received signal that are more susceptible to degradation in the characteristics and the judging device for carrying out a hard-judgment on the other bits of the received signal are provided. Thus, it is possible to reduce the soft-judgment portions having a great number of calculations, and also to achieve a good transmitting characteristic.

Moreover, by estimating the transmission data using the first R/S decoder 19 and the second R/S decoder 21, it becomes possible to reduce the number of iterations, and also to further reduce the soft-judgment portions having a great number of calculations and the processing time thereof. In addition, in the transmission path having random errors and burst errors in a mixed manner as described in the present embodiment, by adopting the R-S codes (Reed Solomon) for carrying out error corrections on a symbol basis and other known error-correction codes in a combined manner, it is possible to obtain a further superior transmission characteristic.

As described above, the communication device is made applicable to communication using the multi-carrier modem system by installing the turbo encoder 1 and the turbo decoder. Therefore, even if the constellation increases as the modulation system is multi-valued, it is possible to reduce the number of calculations and the calculation processing time, and also to achieve a good transmitting characteristic. The 16 QAM system is taken as the modulation method, however, the present invention is not intended to be limited by this method, and the same effects may be obtained even in the case when another modulation method (such as 256 QAM) is used.

As described above, in accordance with the present invention, a transmitter having a construction including a turbo encoder and a receiver having a construction including decoding unit are installed. Therefore, even if the constellation increases as the modulation system is multi-valued, it is possible to provide a communication device which can reduce the number of calculations and the calculation processing time, and also to achieve a good transmitting characteristic.

In accordance with the next invention, the first estimating unit for carrying out a soft-judging process on the lower two bits of a received signal that is more susceptible to degradation in the characteristics, an error-correction unit for carrying out an error-correction process by using Reed Solomon codes and the second estimating unit for carrying out a hard-judging process on the other bits of the received signal are installed. Therefore, it is possible to provide a communication device which, even in the case when the constellation increases as the modulation system is multi-valued, makes it possible to reduce calculations in the soft-judging process having a great number of calculations, and also to achieve a good transmitting characteristic.

In accordance with the next invention, at the time when the error-correction unit makes a judgment that "no error exists" in the information bit list that has been preliminarily estimated, the repeating process in the turbo decoding process is terminated. Therefore, it is possible to provide a communication device which can reduce the number of iterations, and further reduce calculations in the soft-judging process having a great number of calculations as well as the calculation processing time.

In accordance with the next invention, at the time when the error-correction unit makes a judgment that "neither the information bit list estimated based upon the probability information from the first decoder unit nor the information bit list estimated based upon the probability information from the second decoder unit includes any error" the repeating process in the turbo decoding process is terminated. Therefore, it is possible to provide a communication device which can reduce calculations in the soft-judging process having a great number of calculations as well as the calculation processing time, and also improve the estimation precision in the information bits.

In accordance with the next invention, the error-correction unit allows the repeating process to be carried out as many as a predetermined number. Therefore, it is possible to provide a communication device which can reduce the number of iterations, and further reduce calculations in the soft-judging process having a great number of calculations as well as the calculation processing time.

In accordance with the next invention, it is possible to improve characteristics that are susceptible to degradation due to the application of a multi-valued system, and since the turbo encoding is carried out on only the lower two bits of the received signal, it is possible to provide a communication device which can greatly reduce the number of calculations as compared with the conventional technique in which all the bits are turbo encoded. Moreover, by the effects of the interleave process, it is possible to improve the error correction capability with respect to burst-type data errors, and by switching the inputs of information bits between the first convolutional encoder and the second convolutional encoder, it becomes possible to provide a communication device which can uniform the estimation precisions of the information bits on the receiving side.

In accordance with the next invention, even if the constellation increases as the modulation system is multi-valued, it is possible to provide a communication method which can reduce the number of calculations and the calculation processing time, and also achieve a good transmitting characteristic.

In accordance with the next invention, at the time when the error-correction step makes a judgment that "no error exists" in the information bit list that has been preliminarily estimated in the error-correction step, the repeating process in the turbo decoding process is terminated. Therefore, it is possible to provide a communication method which can reduce the number of iterations, and further reduce calculations in the soft-judging process having a great number of calculations as well as the calculation processing time.

In accordance with the next invention, at the time when the error-correction step makes a judgment that "neither the information bit list estimated based upon the probability information from the first decoding step nor the information bit list estimated based upon the probability information from the second decoding step includes any error" the repeating process in the turbo decoding process is terminated. Therefore, it is possible to provide a communication method which can reduce calculations in the soft-judging process having a great number of calculations as well as the calculation processing time, and also improve the estimation precision in the information bits.

In accordance with the next invention, the error-correction step allows the repeating process to be carried out as many as a predetermined number. Therefore, it is possible to provide a communication device which can reduce the number of iterations, and further reduce calculations in the soft-judging process having a great number of calculations as well as the calculation processing time.

INDUSTRIAL APPLICABILITY

As described above, a communication device and a communication method of the present invention are suitable for communications (data, voice, image, etc.) using a method such as the DMT (discrete multi tone) modem system and the OFDM (orthogonal frequency division multiplex) modem system, which are examples of the multi-carrier modem system, and in particular, applicable to a communication device which uses turbo codes as error-correction codes.

What is claimed is:

1. A communication device, which uses turbo codes as error-correction codes, comprising:

a turbo encoder which carries out a turbo encoding process on lower two bits in transmission data to output an information bit list of the two bits, a first redundant bit list generated in a first convolutional encoder having the information bit list of the two bits as an input and a second redundant bit list generated in a second convolutional encoder to which the respective information bit lists that have been subjected to interleave processes are switched and input;

a first decoder unit which extracts the information bit list of the two bits and the first redundant bit list from a received signal, and calculates the probability information of estimated information bits by using the results of the extraction and probability information that has been given as preliminary information;

a second decoder unit which extracts the information bit list of the two bits and the second redundant bit list, and again calculates the probability information of estimated information bits by using the results of the extraction and the probability information from the first decoder unit to inform the first decoder unit of the results as the preliminary information;

a first estimating unit which, based upon the results of the calculation processes of probability information by the first and second decoder units that are repeatedly executed, estimates the information bit list of the original lower two bits for each of the calculation processes;

an error correction unit which carries out an error checking process on the estimated information bit list by using an error correction code, and terminates the repeating process at the time when a judgment shows that the estimation precision exceeds a predetermined reference, as well as simultaneously carrying out an error-correction process on the estimated information bit list of the original lower two bits by using an error correction code; and a second estimating unit which hard-judges the other upper bits in the received signal so as to estimate an information bit list of the original upper bits.

2. The communication device according to claim 1, wherein the error correction unit carries out an error checking process each time the information bit list of the lower two bits is estimated, and terminates the repeating process at the time when a judgment shows that "no error exists" in the estimated information bit list.

3. The communication device according to claim 1, wherein the error correction unit carries out an error checking process each time the information bit list of the lower two bits is estimated, and terminates the repeating process at the time when a judgment shows that "neither the information bit list estimated based upon the probability information from the first decoding unit nor the information bit list estimated based upon the probability information from the second decoding unit includes any error" in the estimated information bit list.

4. The communication device according to claim 1, wherein the error correction unit carries out the repeating process for a predetermined number of times, and after the bit error rate has been reduced, an error-correction process is carried out on the estimated information bit list of the original lower two bits by using error correction codes.

5. A communication device, which serves as a receiver using turbo codes as error-correction codes, comprising:

a first decoder unit which extracts an information bit list of the two bits and a first redundant bit list from a received signal, and calculates the probability information of estimated information bits by using the results of the extraction and probability information that has been given as preliminary information (in some cases, not given);

a second decoder unit which extracts the information bit list of the two bits and a second redundant bit list, and again calculates the probability information of estimated information bits by using the results of the extraction and the probability information from the first decoder unit to inform the first decoder unit of the results as the preliminary information;

a first estimating unit which, based upon the results of the calculation processes of probability information by the first and second decoder unit that are repeatedly executed, estimates the information bit list of the original lower two bits for each of the calculation processes;

an error correction unit which carries out an error checking process on the estimated information bit list by using an error correction code, and terminates the repeating process at the time when a judgment shows that the estimation precision exceeds a predetermined reference, as well as simultaneously carrying out an error-correction process on the estimated information bit list of the original lower two bits by using an error correction code; and a second estimating unit which hard-judges the other upper bits in the received signal so as to estimate an information bit list of the original upper bits.

6. The communication device according to claim 5, wherein the error correction unit carries out an error checking process each time the information bit list of the lower two bits is estimated, and terminates the repeating process at the time when a judgment shows that "no error exists" in the estimated information bit list.

7. The communication device according to claim 5, wherein the error correction unit carries out an error checking process each time the information bit list of the lower two bits is estimated, and terminates the repeating process at the time when a judgment shows that "neither the information bit list estimated based upon the probability information from the first decoding unit nor the information bit list estimated based upon the probability information from the second decoding unit includes any error" in the estimated information bit list.

8. The communication device according to claim 5, wherein the error correction unit carries out the repeating process for a predetermined number of times, and after the bit error rate has been reduced, an error-correction process is carried out on the estimated information bit list of the original lower two bits by using error correction codes.

9. A communication device, which serves as a receiver using the turbo codes as error-correction codes, comprising:

a turbo encoder which carries out a turbo encoding process on lower two bits in transmission data to output an information bit list of the two bits, a first redundant bit list generated in a first convolutional encoder having the information bit list of the two bits as an input and a second redundant bit list generated in a second convolutional encoder to which the respective information bit lists that have been subjected to interleave processes are switched and input.

10. A communication method, which uses turbo codes as error-correction codes, comprising:

a turbo encoding step of carrying out a turbo encoding process on lower two bits in transmission data to output an information bit list of the two bits, a first redundant bit list generated in a first convolutional encoder having the information bit list of the two bits as an input and a second redundant bit list generated in a second convolutional encoder to which the respective information bit lists that have been subjected to interleave processes are switched and input;

a first decoding step of extracting the information bit list of the two bits and the first redundant bit list from a received signal, as well as calculating the probability information of estimated information bits by using the results of the extraction and probability information that has been given as preliminary information (in some cases, not given);

a second decoding step of further extracting the information bit list of the two bits and the second redundant bit list, as well as again calculating the probability information of estimated information bits by using the results of the extraction and the probability information from the first decoding step to inform the first decoding step of the results as the preliminary information;

a first estimating step of estimating the information bit list of the original lower two bits for each of the calculation processes, based upon the results of the calculation processes of probability information by the first and second decoding steps that are repeatedly executed;

an error-correction step of carrying out an error checking process on the estimated information bit list by using an error correction code, and terminating the repeating process at the time when a judgment shows that the estimation precision exceeds a predetermined reference, as well as simultaneously carrying out an error-correction process on the estimated information bit list of the original lower two bits by using an error correction code; and a second estimating step of hard-judging the other upper bits in the received signal so as to estimate an information bit list of the original upper bits.

11. The communication method according to claim 10, herein the error correction step carries out an error checking process each time the information bit list of the lower two bits is estimated, and also terminates the repeating process at the time when a judgment shows that "no error exists" in the estimated information bit list.

12. The communication method according to claim 10, wherein the error correction step carries out an error checking process each time the information bit list of the lower two bits is estimated, and terminates the repeating process at the time when a judgment shows that "neither the information bit list estimated based upon the probability information from the first decoding step nor the information bit list estimated based upon the probability information from the second decoding step includes any error" in the estimated information bit list.

13. The communication method according to claim 10, wherein the error correction step carries out the repeating process for a predetermined number of times, and after the bit error rate has been reduced, an error-correction process is carried out on the estimated information bit list of the original lower two bits by using error correction codes.

* * * * *